(12) United States Patent
Hayashiguchi et al.

(10) Patent No.: US 9,800,239 B2
(45) Date of Patent: Oct. 24, 2017

(54) ELECTRONIC CIRCUIT

(71) Applicant: ROHM CO., LTD., Kyoto-shi, Kyoto (JP)

(72) Inventors: Masashi Hayashiguchi, Kyoto (JP); Kazuhide Ino, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/893,808

(22) PCT Filed: Jun. 10, 2014

(86) PCT No.: PCT/JP2014/065304
§ 371 (c)(1),
(2) Date: Nov. 24, 2015

(87) PCT Pub. No.: WO2014/199970
PCT Pub. Date: Dec. 18, 2014

(65) Prior Publication Data
US 2016/0112043 A1  Apr. 21, 2016

(30) Foreign Application Priority Data
Jun. 11, 2013  (JP) .................................. 2013-122794

(51) Int. Cl.
*H03B 1/00* (2006.01)
*H03K 3/00* (2006.01)
(Continued)

(52) U.S. Cl.
CPC ......... *H03K 17/6872* (2013.01); *H03K 17/08* (2013.01); *H03K 17/08122* (2013.01);
(Continued)

(58) Field of Classification Search
CPC ........................... H03K 17/6872; H03K 17/08
(Continued)

(56) References Cited

U.S. PATENT DOCUMENTS 5,936,387 A * 8/1999 Tabata .................. H02M 7/538
   323/225
5,986,484 A * 11/1999 Kimata .............. H03K 17/0828
   323/908

(Continued)

FOREIGN PATENT DOCUMENTS

EP        1801974       6/2007
JP      2003143833      5/2003

(Continued)

OTHER PUBLICATIONS

International Search Report issued in PCT/JP2014/065304 on Sep. 16, 2014 (2 pages).

(Continued)

*Primary Examiner* — Thomas Skibinski
(74) *Attorney, Agent, or Firm* — Hamre, Schumann, Mueller & Larson, P.C.

(57) ABSTRACT

Provided is an electronic circuit capable of preventing a switching device from breakage when a short-circuit occurs. When a gate control signal CG1 is inverted from an L level to an H level, a first switching circuit 32 selects a first input terminal a, and connects an output terminal d to the first input terminal a, whereby turning on a MOSFET 21. When a predetermined time Tx elapses after the output terminal d of the first switching circuit 32 is connected to the first input terminal a, a second switching circuit 34 selects a first input terminal e, and connects an output terminal g to the first input terminal e. Furthermore, immediately after the connection, the first switching circuit 32 selects a second input terminal b, and connects the output terminal d to the second input terminal b. Consequently, immediately after the MOSFET 21 is turned on, a gate resistor is switched from a first gate resistor 33 having a small resistance value to a second gate resistor 35 having a large resistance value.

10 Claims, 8 Drawing Sheets

(51) Int. Cl.
  *H03K 17/687* (2006.01)
  *H03K 17/0812* (2006.01)
  *H03K 17/12* (2006.01)
  *H03K 17/08* (2006.01)
  *H02M 1/08* (2006.01)
  *H02M 1/00* (2006.01)

(52) U.S. Cl.
  CPC ............ *H03K 17/122* (2013.01); *H02M 1/08* (2013.01); *H02M 2001/0029* (2013.01)

(58) Field of Classification Search
  USPC ........ 327/108–112, 427, 434, 437, 374–377, 327/379–384; 326/82, 83, 87
  See application file for complete search history.

(56) References Cited

U.S. PATENT DOCUMENTS

| | | |
|---|---|---|
| 2005/0001659 A1 | 1/2005 | Inoshita |
| 2006/0186933 A1 | 8/2006 | Kimura et al. |
| 2007/0216461 A1* | 9/2007 | Morino ............... H01L 27/0248 327/287 |
| 2010/0283515 A1 | 11/2010 | Kelley et al. |
| 2011/0241738 A1 | 10/2011 | Tamaoka |
| 2012/0063180 A1* | 3/2012 | Mizuno ................... H02H 7/12 363/50 |

FOREIGN PATENT DOCUMENTS

| | | | |
|---|---|---|---|
| JP | 2005-39988 A | | 2/2005 |
| JP | 2005-45963 A | | 2/2005 |
| JP | 2005045963 A | * | 2/2005 |
| JP | 2005-137072 A | | 5/2005 |
| JP | 2006-230166 A | | 8/2006 |
| JP | 2012-55125 A | | 3/2012 |

OTHER PUBLICATIONS

International Preliminary Report on Patentability and Written Opinion, and English translation, PCT/JP2014/065304, Sep. 16, 2014 (18 pages).
Extended European Search Report issued for corresponding European Patent Application No. 14810709.7, dated May 19, 2017, 11 pages.
Partial Supplementary European Search Report issued for corresponding European Patent Application No. 14810709.7, dated Jan. 26, 2017, 7 pages.

* cited by examiner

# ELECTRONIC CIRCUIT

TECHNICAL FIELD

The present invention relates to an electronic circuit such as an inverter circuit and a converter circuit.

BACKGROUND ART

A switching device to be used in an electronic circuit such as an inverter circuit and a converter circuit consists of one switching element or a plurality of switching elements connected in parallel. As switching elements, in addition to Si switching elements chiefly made of Si (silicon), SiC switching elements chiefly made of SiC (silicon carbide) have been developed. SiC switching elements include SiC-MOSFETs (Metal-Oxide-Semiconductor Field Effect Transistors), SiC-bipolar transistors, SiC-JFETs (Junction Field Effect Transistors), and SiC-IGBTs (Insulated Gate Bipolar Transistors), etc.

CITATION LIST

Patent Literature

PTL 1: Japanese Patent Application Publication No. 2005-137072

SUMMARY OF INVENTION

Problem to be Solved by the Invention

In an electronic circuit using a voltage control type switching device, when a short-circuit that causes a power supply voltage to be directly applied to the voltage control type switching device occurs, a short-circuit current flows in the voltage control type switching device. When a short-circuit current flows in the voltage control type switching device, the temperature of the voltage control type switching device rises, and due to a tunneling effect, a leak current (gate current) flows to a gate oxide film of the voltage control type switching device. This leak current increases with the temperature rise of the voltage control type switching device. Then, when a charge amount that passes through the gate oxide film exceeds a break-down charge amount of the gate oxide film, the gate oxide film is broken. That is, the voltage control type switching device is broken.

Figure 8:
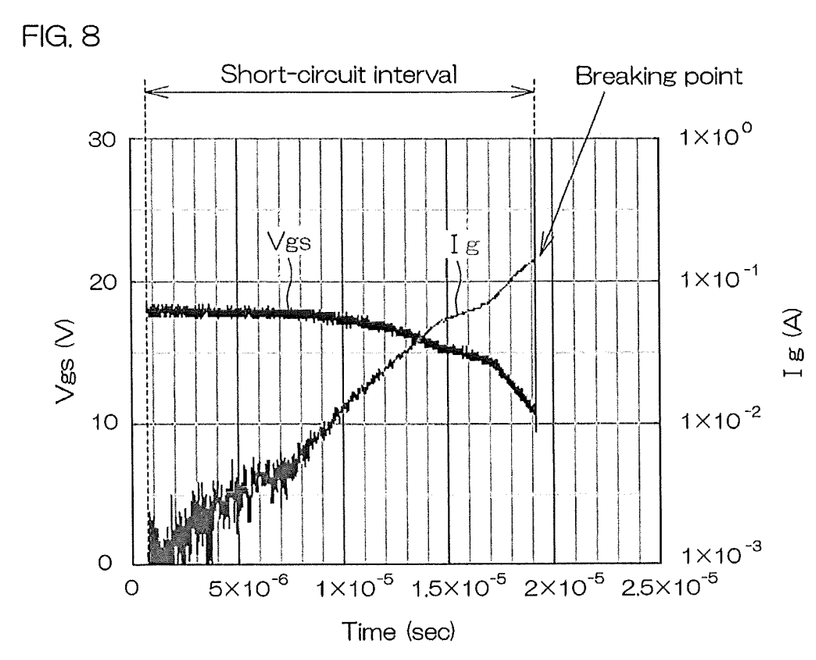
FIG. 8 is a graph showing temporal changes of the gate current and the gate-source voltage when a short-circuit test was conducted by connecting a voltage control type switching device consisting of a plurality of SiC-MOSFETs to a normal gate drive circuit.

FIG. 8 is a graph showing temporal changes of the gate current and the gate-source voltage when a short-circuit test was conducted by connecting a voltage control type switching device consisting of a plurality of SiC-MOSFETs to a normal gate drive circuit. The short-circuit test was conducted by directly applying a power supply voltage between the drain and the source of the voltage control type switching device in a state where the voltage control type switching device was in an ON state.

When a power supply voltage is directly applied to the voltage control type switching device, the gate current Ig (leak current) increases. On the other hand, the gate-source voltage Vgs decreases. When an integrated value of the gate current Ig reaches a predetermined value, the voltage control type switching device is broken.

An object of the present invention is to provide an electronic circuit which makes a voltage control type switching device is less like to be broken when a short-circuit occurs.

Means for Solving the Problem

A first electronic circuit according to the present invention includes a voltage control type switching device, a first gate resistor that has one end connected to a gate terminal of the voltage control type switching device, a second gate resistor that has one end connected to the gate terminal of the voltage control type switching device, and has a resistance value larger than that of the first gate resistor, and a switching circuit that switches the gate resistor such that a gate voltage is applied for a predetermined time to the gate terminal of the voltage control type switching device via the first gate resistor and then the gate voltage is applied to the gate terminal via the second gate resistor when turning on the voltage control type switching device.

According to the present invention, after the voltage control type switching device is turned on, the gate resistor can be switched to the second gate resistor having a resistance value larger than that of the first gate resistor. Accordingly, when a short-circuit that causes a power supply voltage to be directly applied to the voltage control type switching device occurs, an increase in the gate current of the voltage control type switching device can be suppressed. Accordingly, when a short-circuit occurs, the voltage control type switching device becomes less likely to be broken.

In a preferred embodiment of the present invention, the switching circuit is arranged to turn the other end of the second gate resistor into a high-impedance state and ground the other end of the first gate resistor when turning off the voltage control type switching device.

In a preferred embodiment of the present invention, the resistance value of the first gate resistor is not less than 1Ω and not more than 5Ω, and the resistance value of the second gate resistor is not less than 1 kΩ.

In a preferred embodiment of the present invention, on the assumption that the resistance value of the gate resistor is fixed at the resistance value of the first gate resistor, when T is an estimate value of the time from the start of flowing of a short-circuit current in the voltage control type switching device to breakage of the voltage control type switching device, the predetermined time is set to not less than 1/10 and not more than 1/5 of the estimate value T.

A second electronic circuit according to the present invention includes a voltage control type switching device, a current detection means that detects a gate current of the voltage control type switching device, and a gate terminal grounding means that grounds a gate terminal of the voltage control type switching device when the gate current detected by the current detection means becomes larger than a predetermined value.

According to the present invention, when a short-circuit that causes a power supply voltage to be directly applied to a voltage control type switching device occurs, the short-circuit current can be interrupted.

A third electronic circuit according to the present invention includes a voltage control type switching device, a current detection means that detects a gate current of the voltage control type switching device, a current integrated value calculation means that calculates an integrated value of the gate current detected by the current detection means, and a warning signal output means that outputs a warning signal when a gate current integrated value calculated by the current integrated value calculation means exceeds a predetermined value.

It is considered that the larger the gate current integrated value calculated by the current integrated value calculation means, the shorter the residual life of the voltage control type switching device. In the present invention, when the residual life of the voltage control type switching device becomes short, a warning signal is output, so that a user of the electronic circuit can be informed that the residual life of the voltage control type switching device has become short. Accordingly, it becomes easy to grasp the time for replacement of the voltage control type switching device.

In a preferred embodiment of the present invention, the voltage control type switching device consists of one voltage control type switching element or a plurality of voltage control type switching elements connected in parallel.

In a preferred embodiment of the present invention, the voltage control type switching elements are voltage control type switching elements chiefly made of SiC.

The aforementioned or other objects, features, and effects of the present invention will be clarified by the following description of embodiments with reference to the accompanying drawings.

BEST MODE FOR CARRYING OUT THE INVENTION

Hereinafter, preferred embodiments of the present invention are described in detail with reference to the accompanying drawings.

Figure 1:
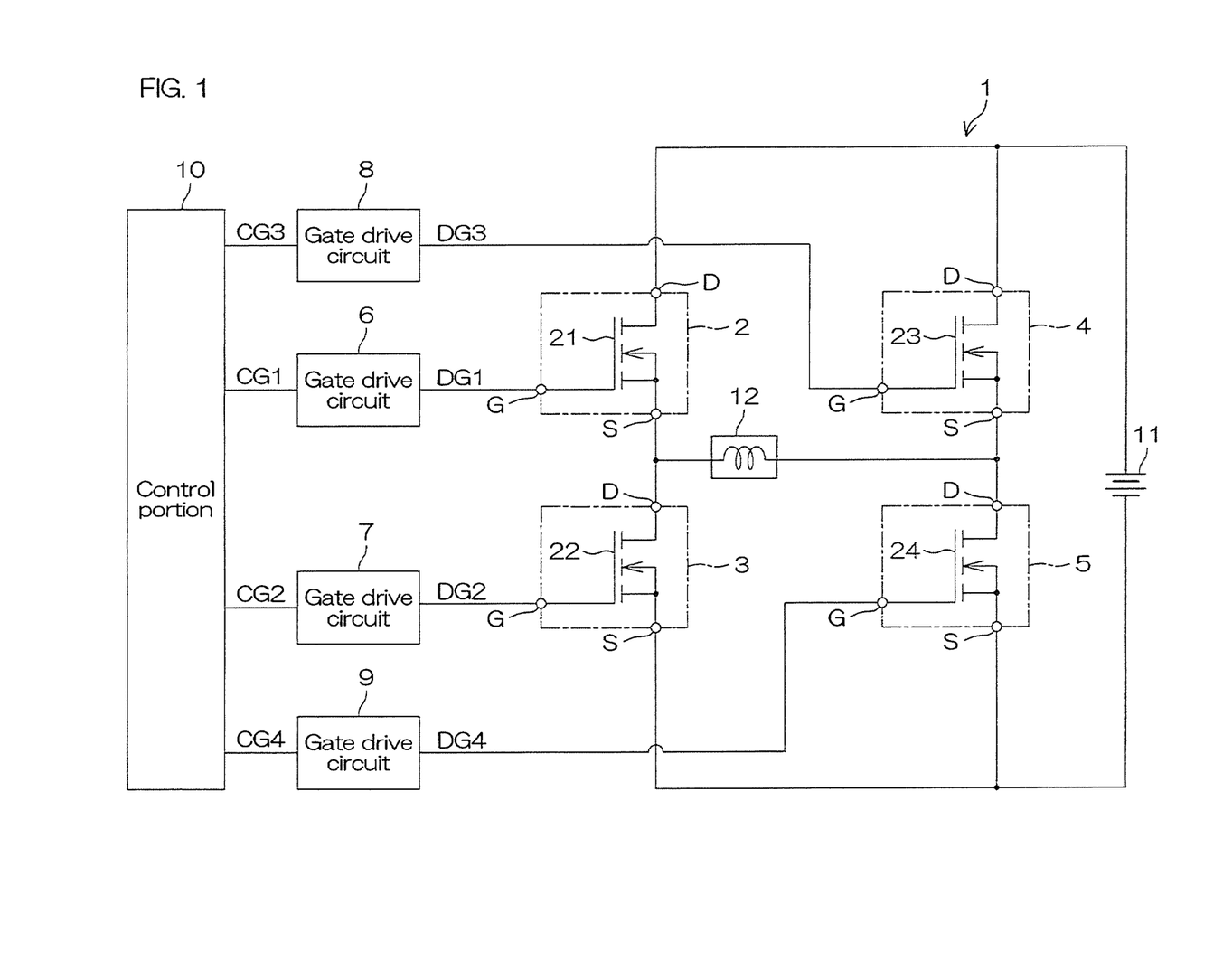
FIG. 1 is an electric circuit diagram showing an inverter circuit according to a first preferred embodiment of the present invention.

FIG. 1 is an electric circuit diagram showing an inverter circuit according to a first preferred embodiment of the present invention.

An inverter circuit 1 includes first to fourth modules (voltage control type switching devices) 2 to 5, first to fourth gate drive circuits 6 to 9, and a control portion 10.

Figure 2:
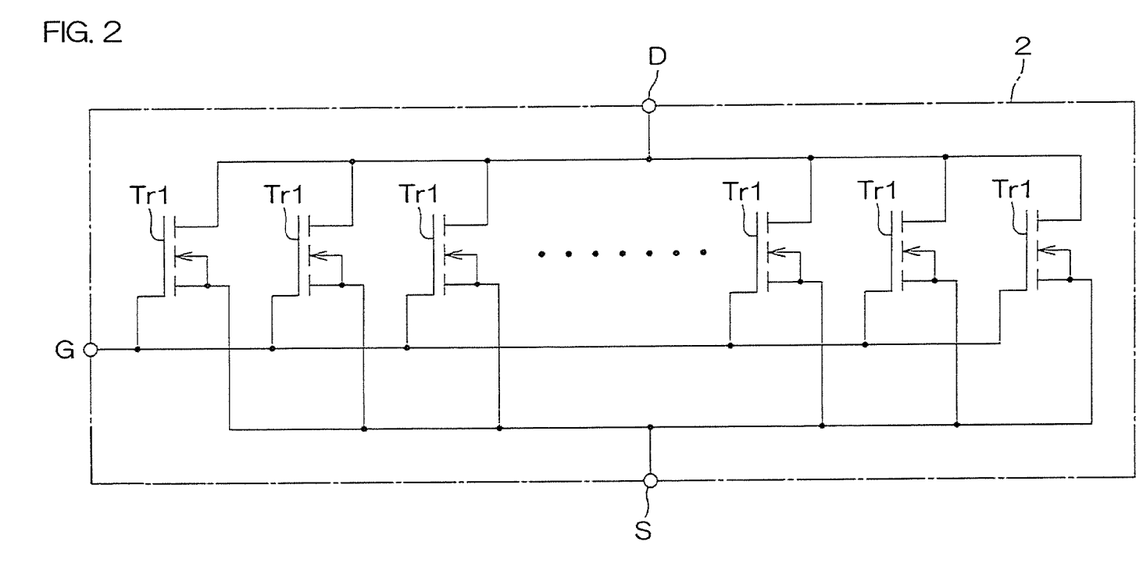
FIG. 2 is a pictorial plan view showing an electrical arrangement of a first module.

FIG. 2 is an electric circuit diagram showing an electrical arrangement of the first module 2.

The first module 2 includes a plurality of voltage control type switching elements Tr (chips). The voltage control type switching elements Tr consist of N-channel type MOSFETs. In particular, in the present preferred embodiment, the voltage control type switching elements are SiC-MOSFETs chiefly made of SiC (silicon carbide). The first module 2 also includes a drain terminal D, a source terminal S, and a gate terminal G. The plurality of voltage control type switching elements Tr are connected in parallel between the drain terminal D and the source terminal S. The SiC switching elements such as SiC-MOSFETs are difficult to be increased in chip size in comparison with Si switching elements, so that in a module consisting of a plurality of SiC switching elements, the number of switching elements connected in parallel becomes larger than in a module consisting of a plurality of Si switching elements in many cases.

The drains of the plurality of voltage control type switching elements Tr are connected to the drain terminal D. The sources of the plurality of voltage control type switching elements Tr are connected to the source terminal S. The gates of the plurality of voltage control type switching elements Tr are connected to the gate terminal G. The second, third, and fourth modules 3 to 5 are the same in the arrangement as that of the first module 2.

In FIG. 1, the parallel circuit of the plurality of voltage control type switching elements Tr inside the first module 2 is simply represented by one MOSFET 21 (hereinafter, referred to as "first MOSFET 21"). Similarly, the parallel circuit of the plurality of voltage control type switching elements Tr inside the second module 3 is simply represented by one MOSFET 22 (hereinafter, referred to as "second MOSFET 22"). Similarly, the parallel circuit of the plurality of voltage control type switching elements Tr inside the third module 4 is simply represented by one MOSFET 23 (hereinafter, referred to as "third MOSFET 23"). Similarly, the parallel circuit of the plurality of voltage control type switching elements Tr inside the fourth module 5 is simply represented by one MOSFET 24 (hereinafter, referred to as "fourth MOSFET 24").

The drain terminal D of the first MOSFET 21 is connected to the positive terminal of the power supply 11. The source terminal S of the first MOSFET 21 is connected to the drain terminal D of the second MOSFET 22. The gate terminal G of the first MOSFET 21 is connected to the first gate drive circuit 6.

The source terminal S of the second MOSFET 22 is connected to the negative terminal of the power supply 11. The gate terminal G of the second MOSFET 22 is connected to the second gate drive circuit 7.

The drain terminal D of the third MOSFET 23 is connected to the positive terminal of the power supply 11. The source terminal S of the third MOSFET 23 is connected to the drain terminal D of the fourth MOSFET 24. The gate terminal G of the third MOSFET 23 is connected to the third gate drive circuit 8.

The source terminal S of the fourth MOSFET 24 is connected to the negative terminal of the power supply 11. The gate terminal G of the fourth MOSFET 24 is connected to the fourth gate drive circuit 9. Between the connection point between the first module 2 and the second module 3 and the connection point between the third module 4 and the fourth module 5, a load 12 is connected.

The control portion 10 consists of a microcomputer including a CPU and a memory (ROM, RAM, etc.) storing programs, etc., of the CPU. The control portion 10 generates a first gate control signal CG1 for the first MOSFET 21, a second gate control signal CG2 for the second MOSFET 22, a third gate control signal CG3 for the third MOSFET 23, and a fourth gate control signal CG4 for the fourth MOSFET 24, and provides these signals to the first, second, third, and fourth gate drive circuits 6, 7, 8, and 9, respectively.

The respective gate drive circuits 6, 7, 8, and 9 generate and output gate driving signals DG1, DG2, DG3, and DG4 for the first MOSFET 21, the second MOSFET 22, the third MOSFET 23, and the fourth MOSFET 24, respectively, based on the gate control signals CG1, CG2, CG3, and CG4 provided from the control portion 10. In the present preferred embodiment, each of the respective gate driving signals DG1, DG2, DG3, and DG4 goes to an L level when the corresponding gate control signal CG1, CG2, CG3, or CG4 is at an L level, and goes to an H level when the corresponding gate control signal CG1, CG2, CG3, or CG4 is at an H level.

The gate driving signals DG1, DG2, DG3, and DG4 are provided to the gate terminals G of the first MOSFET 21, the second MOSFET 22, the third MOSFET 23, and the fourth MOSFET 24, respectively. Each of the MOSFETs 21, 22, 23, and 24 is turned on when the gate driving signal to be provided thereto goes to an H level, and is turned off when the gate driving signal to be provided thereto goes to an L level.

In such an inverter circuit 1, for example, the first MOSFET 21 and the fourth MOSFET 24 are turned on. Thereafter, according to turning-off of these MOSFETs 21 and 24, all MOSFETs 21 to 24 are brought into an OFF state. After a predetermined dead time elapses, the second MOSFET 22 and the third MOSFET 23 are turned on in turn. Thereafter, according to turning-off of these MOSFETs 22 and 23, all MOSFETs 21 to 24 are brought into an OFF state. After a predetermined dead time elapses, the first MOSFET 21 and the fourth MOSFET 24 are turned on again. By repeating these operations, the load 12 is AC-driven.

As described above, in a case where a short-circuit that causes a power supply voltage to be directly applied to the MOSFET occurs, due to an increase in the gate current, the gate oxide film is broken. Therefore, each of the gate drive circuits 6, 7, 8, and 9 has a function to suppress an increase in the gate current of the corresponding MOSFET 21, 22, 23, or 24 when a short-circuit that causes a power supply voltage to be directly applied to the corresponding MOSFET 21, 22, 23, or 24 occurs.

The case where a short-circuit that causes a power supply voltage to be directly applied to the MOSFETs 21, 22, 23, and 24 occurs includes, for example, a case where the load 12 is short-circuited, a case where the two MOSFETs (21 and 22, 23 and 24) connected in series between the positive terminal and the negative terminal of the power supply 11 are simultaneously turned on, and a case where a short-circuit fault occurs in either one of the two MOSFETs (21 and 22, 23 and 24) connected in series between the positive terminal and the negative terminal of the power supply 11. The respective gate drive circuits 6, 7, 8, and 9 have the same arrangement, and therefore, the arrangement of the first gate drive circuit 6 is described in detail, hereinafter.

Figure 3:
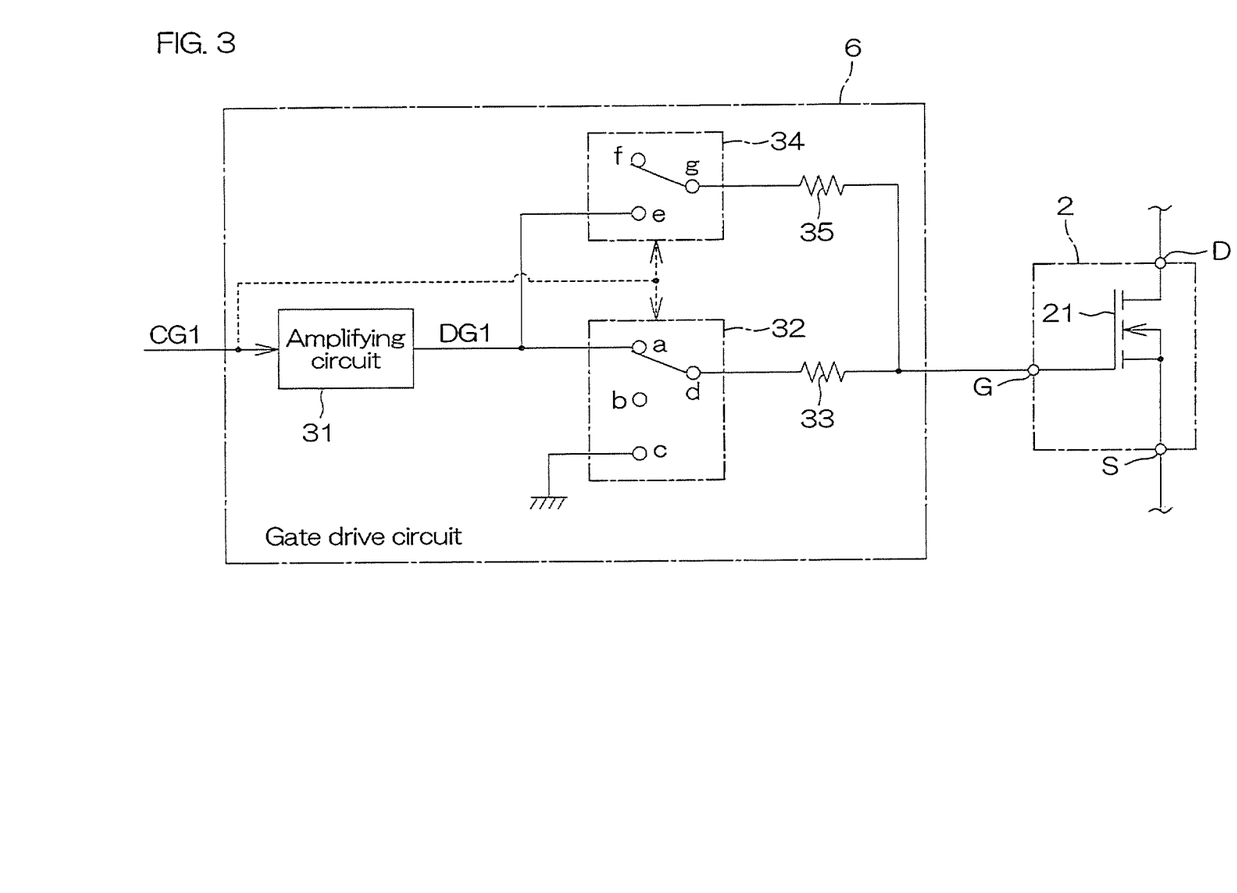
FIG. 3 is an electric circuit diagram showing an electrical arrangement of a first gate drive circuit.

FIG. 3 is an electric circuit diagram showing the electrical arrangement of the first gate drive circuit 6.

The first gate drive circuit 6 includes an amplifying circuit 31, a first switching circuit 32, a first gate resistor 33, a second switching circuit 34, and a second gate resistor 35. The resistance value r2 of the second gate resistor 35 is larger than the resistance value r1 of the first gate resistor 33. The resistance value r1 of the first gate resistor 33 is set to a value not less than 1Ω and not more than 5Ω. In the present preferred embodiment, the resistance value r1 of the first gate resistor 33 is, for example, 3.9Ω. The resistance value r2 of the second gate resistor 35 is set to a value not less than 1 kΩ. In the present preferred embodiment, the resistance value r2 of the second gate resistor 35 is, for example, 18 kΩ.

To the input terminal of the first amplifying circuit 31, the gate control signal CG1 from the control portion 10 is input. The amplifying circuit 31 amplifies the gate control signal CG1 and generates the gate driving signal DG1.

The first switching circuit 32 has three input terminals a, b, and c and one output terminal d, and selects any one of the input terminals a, b, and c and connects the output terminal d to the selected input terminal. Hereinafter, the input terminal a is referred to as a first input terminal a, the input terminal b is referred to as a second input terminal b, and the input terminal c is referred to as a third input terminal c. To the first input terminal a, the gate driving signal DG1 is input. The second input terminal b is in an open state. The third input terminal c is grounded. To the output terminal d of the first switching circuit 32, one end of the first gate resistor 33 is connected. The other end of the first gate resistor 33 is connected to the gate terminal G of the MOSFET 21.

The second switching circuit 34 has two input terminals e and f and one output terminal g, and selects either one of the input terminals e and f and connects the output terminal g to the selected input terminal. Hereinafter, the input terminal e is referred to as a first input terminal e, and the input terminal f is referred to as a second input terminal f. To the first input terminal e, the gate driving signal DG1 is input. The second input terminal f is in an open state. To the output terminal g, one end of the second gate resistor 35 is connected. The other end of the second gate resistor 35 is connected to the gate terminal G of the first MOSFET 21. The first switching circuit 32 and the second switching circuit 34 are controlled by the gate control signal CG1 from the control portion 10.

Figure 4:
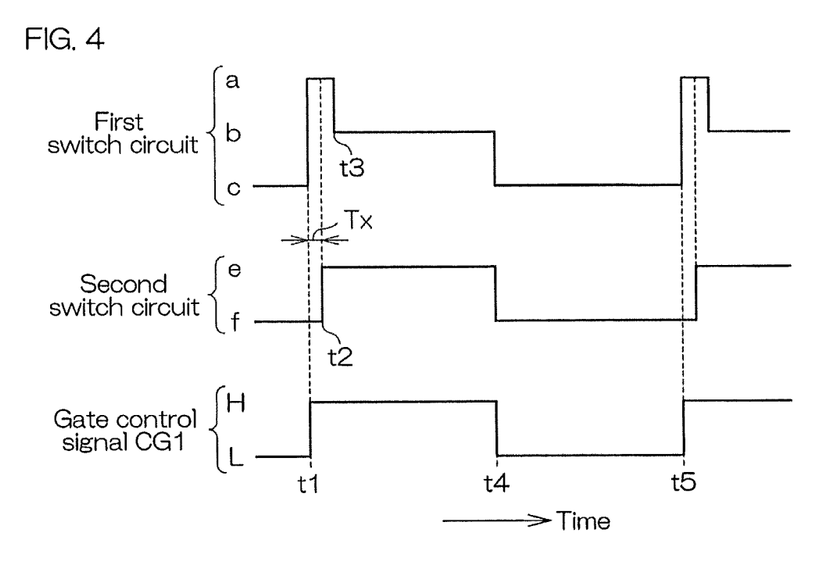
FIG. 4 is a time chart showing operations of a first switching circuit and a second switching circuit.

FIG. 4 is a time chart showing operations of the first switching circuit 32 and the second switching circuit 34.

When the gate control signal CG1 is at an L level, the second switching circuit 34 selects the second input terminal f and connects the output terminal g to the second input terminal f. Therefore, the output terminal g of the second switching circuit 34 is in a high-impedance state. When the gate control signal CG1 is at an L level, the first switching circuit 32 selects the third input terminal c and connects the output terminal d to the third input terminal c. Therefore, the output terminal d of the first switching circuit 32 is grounded. That is, when the gate control signal CG1 is at an L level, the gate terminal G of the first MOSFET 21 is grounded via the first switching circuit 32.

When the gate control signal CG1 is inverted from the L level to an H level (point t1), the first switching circuit 32 selects the first input terminal a and connects the output terminal d to the first input terminal a. Accordingly, the gate driving signal DG1 output from the amplifying circuit 31 is provided to the gate terminal G of the first MOSFET 21 via the first switching circuit 32 and the first gate resistor 33. Accordingly, a gate voltage is applied to the gate terminal G of the first MOSFET 21, so that the first MOSFET 21 is turned on.

Since the gate of the first MOSFET 21 has a capacity (capacitor component), when an attempt is made to apply the gate voltage to the gate terminal G of the first MOSFET 21, charges must be provided until the capacitor is charged. Therefore, to supply charges for charging the capacitor to the gate terminal G, the resistance value r1 of the first gate resistor 33 is set to a small value.

When a predetermined time Tx elapses after the output terminal d of the first switching circuit 32 is connected to the first input terminal a (point t2), the second switching circuit 34 selects the first input terminal e and connects the output terminal g to the first input terminal e. Accordingly, the gate driving signal DG1 output from the amplifying circuit 31 is provided to the output terminal g of the second switching circuit 34. Immediately after this, the first switching circuit 32 selects the second input terminal b and connects the output terminal d to the second input terminal b (point t3). Accordingly, the output terminal d of the first switching circuit 32 is put into a high-impedance state, so that the gate driving signal DG1 is provided to the gate terminal G of the first MOSFET 21 via the second switching circuit 34 and the second gate resistor 35. That is, immediately after the first MOSFET 21 is turned on, the gate resistor is switched from the first gate resistor 33 having a small resistance value to the second gate resistor 35 having a large resistance value. Thus, even after the gate resistor is switched to one having a larger resistance value, application of the gate voltage to the gate terminal G of the first MOSFET 21 is continued, so that the first MOSFET 21 is maintained in an ON state.

On the assumption that the resistance value of the gate resistor is fixed at the resistance value r1 of the first gate resistor 33, when T is an estimate value of a time from the start of flowing of a short-circuit current in the MOSFET 21 to breakage of the MOSFET 21, the predetermined time Tx is set to a value of 1/10 or more and 1/5 or less of the estimate value T.

In the present preferred embodiment, the estimate value T was calculated as follows. A sample with the same structure as that of the MOSFET 21 was prepared. The sample was connected to a gate drive circuit (hereinafter, referred to as a "gate drive circuit of a comparative example") including only a gate resistor having the same resistance value as that of the resistance value r1 of the first gate resistor 33, and a short-circuit test was conducted. The short-circuit test was conducted by directly applying a power supply voltage between the drain and the source of the sample when the sample was in an ON state. Then, the time taken from the start of a short-circuit to breakage of the sample was measured, and this measured value was used as the estimate value T. The time from the start of a short-circuit to breakage of the sample was approximately 7 [μsec]. In the present preferred embodiment, the predetermined time Tx was set to 1 [μsec].

Thereafter, when the gate control signal CG1 is inverted from the H level to the L level (point t4), the second switching circuit 34 selects the second input terminal f and connects the output terminal g to the second input terminal f. Accordingly, the output terminal g of the second switching circuit 34 is put into a high-impedance state. The first switching circuit 32 selects the third input terminal c and connects the output terminal d to the third input terminal c. Accordingly, the output terminal d of the first switching circuit 32 is grounded. That is, the gate terminal G of the MOSFET 21 is grounded via the first switching circuit 32. Accordingly, the MOSFET 21 is turned off.

Thereafter, when the gate control signal CG1 is inverted from the L level to the H level (point t5), the same operation as that described above is performed, and accordingly, the MOSFET 21 is turned on. Also in this case, immediately after the MOSFET 21 is turned on, switching of the gate resistor is performed.

In the present preferred embodiment, immediately after the first MOSFET 21 is turned on, the gate resistor can be switched to the second gate resistor 35 having a resistance value larger than that of the first gate resistor 33. Therefore, in a case where a short-circuit that causes a power supply voltage to be directly applied to the first MOSFET 21 occurs, an increase in the gate current of the first MOSFET 21 can be suppressed. Accordingly, when a short-circuit occurs, the time until the first MOSFET 21 is broken becomes longer. As a result, when a short-circuit occurs, the first MOSFET 21 becomes less likely to be broken. The same applies to the second to fourth MOSFETs 22 to 24.

Figure 5:
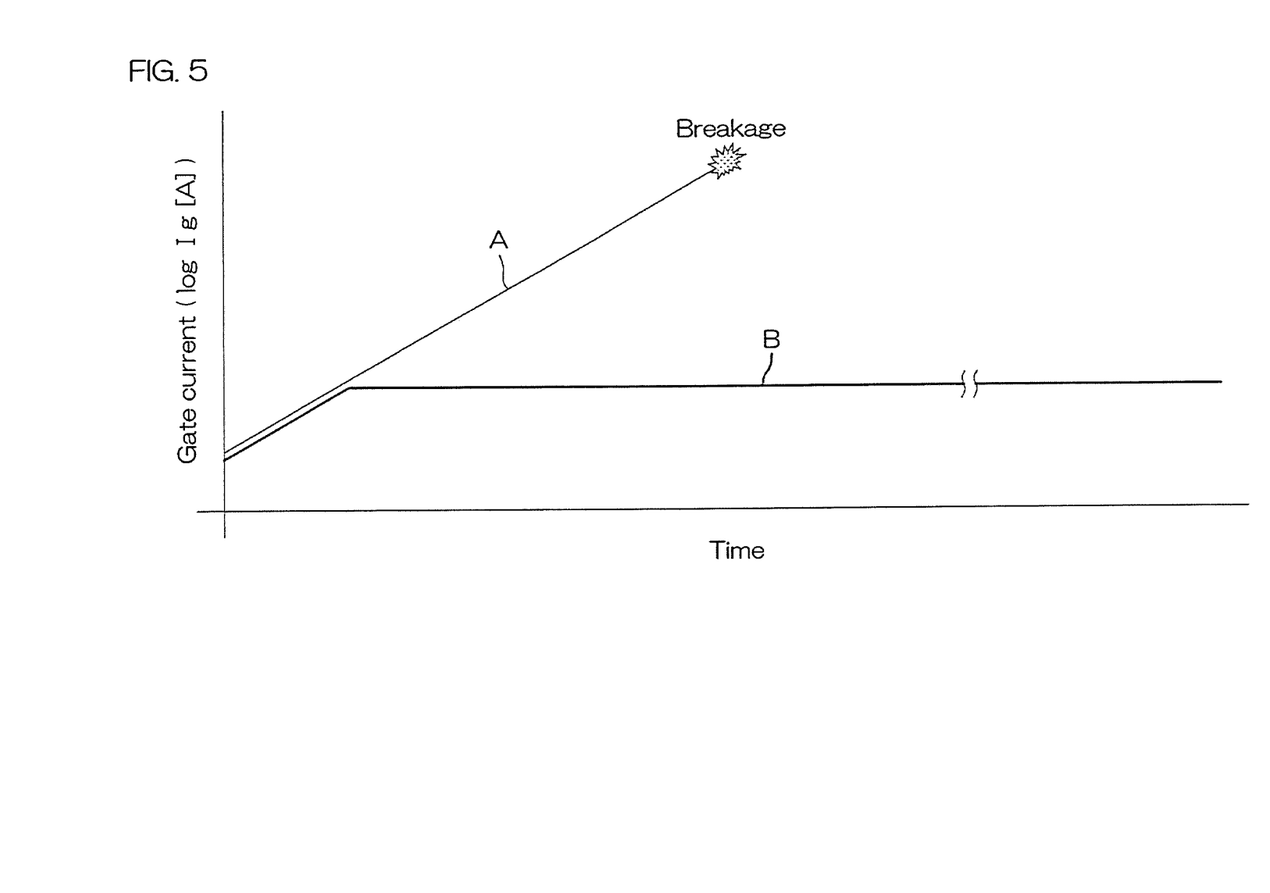
FIG. 5 is a graph schematically showing changes of the gate currents of the MOSFETs when a short-circuit occurs.

FIG. 5 is a graph schematically showing changes of the gate current Ig of the MOSFET 21 when a short-circuit occurs. Note that the vertical axis shows the logarithm of the gate current Ig. In FIG. 5, the straight line A shows changes of the gate current of the MOSFET when the gate drive circuit of the comparative example is used instead of the gate drive circuit 6. In FIG. 5, the polygonal line B shows changes of the gate current of the MOSFET 21 when a short-circuit occurs in the present preferred embodiment.

When the gate drive circuit of the comparative example is used, as shown by the straight line A, the gate current Ig of the MOSFET increases with a lapse of time, and when the integrated value of the gate current Ig reaches a predetermined value, the MOSFET is broken. On the other hand, in the present preferred embodiment, as shown by the polygonal line B, although the gate current of the MOSFET 21 increases initially, after it reaches a certain value, it no longer increases. That is, in the present preferred embodiment, when a short-circuit occurs, an increase in the gate current of the first MOSFET 21 is suppressed.

Figure 6:
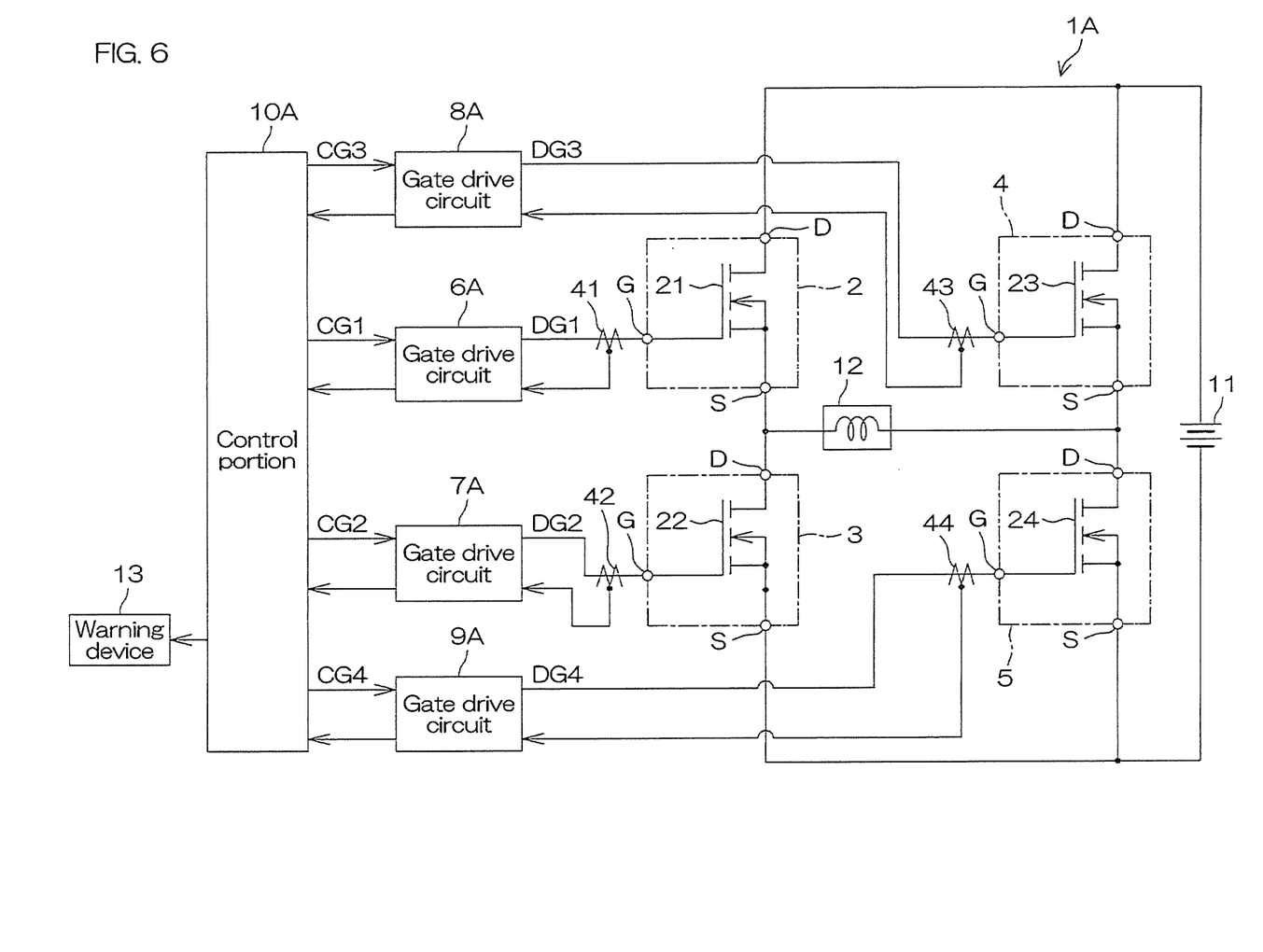
FIG. 6 is an electric circuit diagram showing an inverter circuit according to a second preferred embodiment of the present invention.

FIG. 6 is an electric circuit diagram showing an inverter circuit according to a second preferred embodiment of the present invention. In FIG. 6, portions corresponding to the respective portions shown in FIG. 1 described above are designated by the same reference signs as those in FIG. 1.

The inverter circuit 1A in FIG. 6 includes first to fourth modules (voltage control type switching devices 2 to 5), first to fourth gate drive circuits 6A to 9A, and a control portion 10A.

Each of the modules 2 to 5 consists of, similar to the modules 2 to 5 in FIG. 1, a plurality of voltage control type switching elements Tr connected in parallel. Also in this preferred embodiment, the voltage control type switching elements Tr are SiC-MOSFETs. In FIG. 6, as in FIG. 1, the first module 2, the second module 3, the third module 4, and the fourth module 5 are simply represented by the first MOSFET 21, the second MOSFET 22, the third MOSFET 23, and the fourth MOSFET 24, respectively.

In the inverter circuit 1A in FIG. 6, on the connecting lines connecting the respective gate drive circuits 6A to 9A and the gate terminals G of the corresponding MOSFETs 21 to 24, current sensors 41 to 44 that detect the gate currents Ig, respectively, are provided. Detection signals of the respective current sensors 41 to 44 are input to the corresponding gate drive circuits 6A to 9A.

The control portion 10A generates a first gate control signal CG1 for the first MOSFET 21, a second gate control signal CG2 for the second MOSFET 22, a third control signal CG3 for the third MOSFET 23, and a fourth gate control signal CG4 for the fourth MOSFET 24 and provides these to the first, second, third, and fourth gate drive circuits 6A, 7A, 8A, and 9A, respectively.

To the control portion 10A, a warning device 13 is connected. The warning device 13 is, for example, an alarm sound producing device that produces an alarm sound. The warning device 13 may be an audio output device that outputs an audio warning message, or a display device that displays a warning message. The warning device 13 may consist of an arbitrary combination of two or more devices selected among an alarm sound producing device, an audio output device, and a display device.

The respective gate drive circuits 6A, 7A, 8A, and 9A generate and output gate driving signals DG1, DG2, DG3, and DG4 for the first MOSFET 21, the second MOSFET 22, the third MOSFET 23, and the fourth MOSFET 24, respectively, based on the gate control signals CG1, CG2, CG3, and CG4 provided from the control portion 10A.

The gate driving signals DG1, DG2, DG3, and DG4 are provided to the gate terminals G of the first MOSFET 21, the second MOSFET 22, the third MOSFET 23, and the fourth MOSFET 24, respectively. Each of the MOSFETs 21, 22, 23, and 24 is turned on when the gate driving signal provided thereto goes to an H level, and turned off when the gate driving signal provided thereto goes to an L level.

Each of the gate drive circuits 6A, 7A, 8A, and 9A has a function to suppress an increase in the gate current of the corresponding MOSFET 21, 22, 23, or 24 when a short-circuit that causes a power supply voltage to be directly applied to the corresponding MOSFET 21, 22, 23, or 24 occurs as in the case of the first preferred embodiment.

Each of the gate drive circuits 6A, 7A, 8A, and 9A also has a function to determine whether a short-circuit that causes a power supply voltage to be directly applied to the corresponding MOSFET 21, 22, 23, or 24 has occurred based on the gate current of the corresponding MOSFET 21, 22, 23, or 24 and interrupt the short-circuit current when it determines that a short-circuit has occurred.

Further, each of the gate drive circuits 6A, 7A, 8A, and 9A has a function to predict the residual life of the corresponding MOSFET 21, 22, 23, or 24 based on the gate current of the corresponding MOSFET 21, 22, 23, or 24 and output a warning signal when the residual life becomes short.

The gate drive circuits 6A, 7A, 8A, and 9A have the same arrangement, so that the arrangement of the first gate drive circuit 6A is described in detail, hereinafter.

Figure 7:
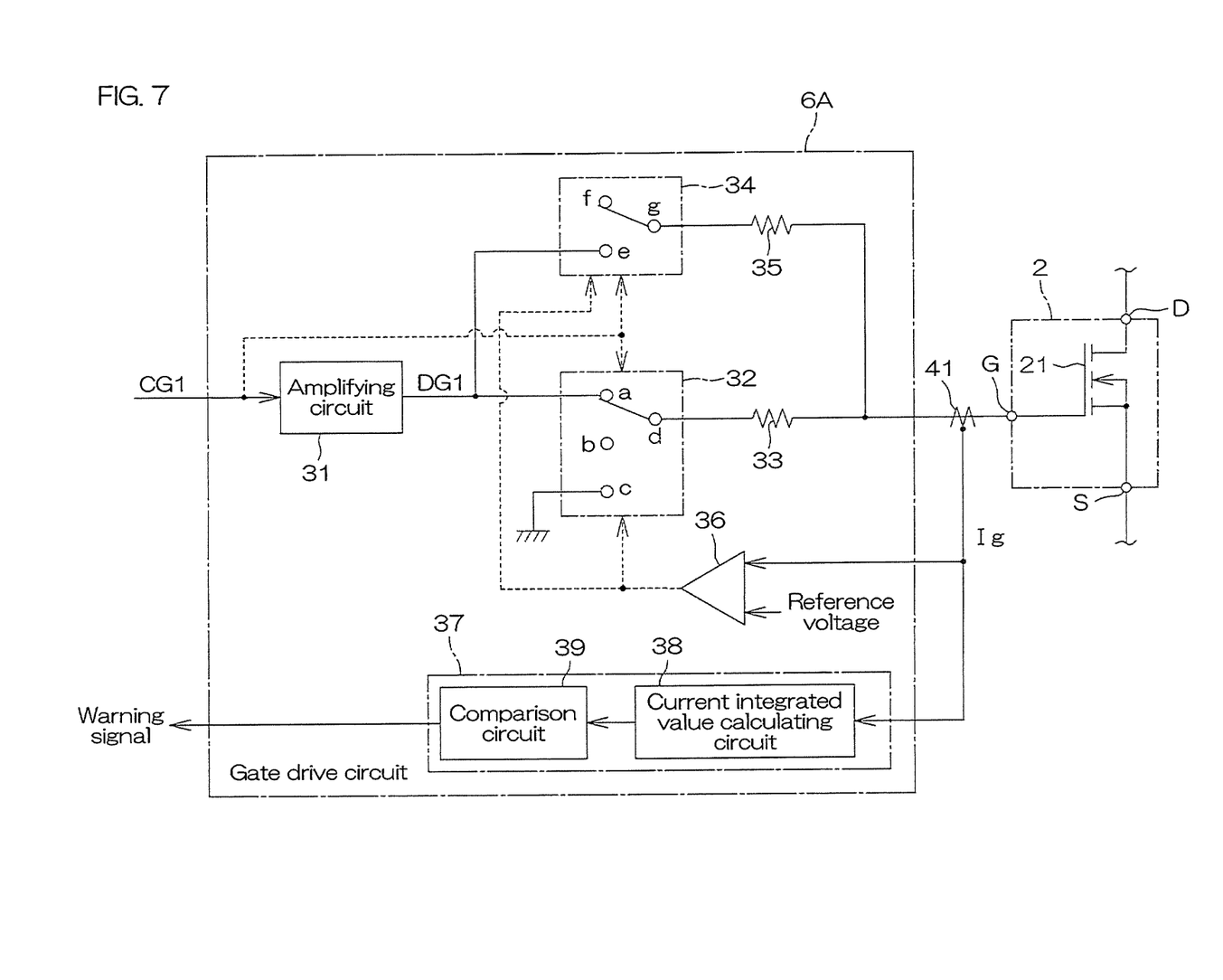
FIG. 7 is an electric circuit diagram showing an electrical arrangement of a first gate drive circuit.

FIG. 7 is an electric circuit diagram showing an electrical arrangement of the first gate drive circuit 6A. In FIG. 7, portions corresponding to the respective portions shown in FIG. 3 described above are designated by the same reference signs as those in FIG. 3.

The first gate drive circuit 6A includes an amplifying circuit 31, a first switching circuit 32, a first gate resistor 33, a second switching circuit 34, a second gate resistor 35, a short-circuit detecting circuit 36, and a residual life predicting circuit 37.

The amplifying circuit 31, the first gate resistor 33, and the second gate resistor 35 are the same as the amplifying circuit 31, the first gate resistor 33, and the second gate resistor 35 shown in FIG. 3, respectively, and therefore, description of these is omitted.

Arrangements of the first switching circuit 32 and the second switching circuit 34 are the same as those of the first switching circuit 32 and the second switching circuit 34 shown in FIG. 3, respectively. However, the first switching circuit 32 and the second switching circuit 34 are different from those in the first preferred embodiment in that they are controlled by the gate control signal CG1 and also controlled by a short-circuit current detection signal output from the short-circuit detecting circuit 36.

Operations of both switching circuits 32 and 34 when the gate control signal CG1 is inverted from an L level to an H level and operations of both switching circuits 32 and 34 when the gate control signal CG1 is inverted from an H level to an L level are the same as those in the first preferred embodiment. Therefore, the above-described function to suppress an increase in the gate current of the first MOSFET 21 when a short-circuit occurs is also achieved in the second preferred embodiment.

The short-circuit detecting circuit 36 determines that a short-circuit has occurred and outputs a short-circuit detection signal when the gate current of the first MOSFET 21 detected by the current sensor 41 becomes larger than a predetermined value. This is a result of focusing on the fact that the gate current of the first MOSFET 21 increases when a short-circuit that causes a power supply voltage to be directly applied to the first MOSFET 21 occurs. Specifically, when the output voltage of the current sensor 41 becomes larger than a predetermined reference voltage, the short-circuit current detecting circuit 36 outputs a short-circuit detection signal to the first switching circuit 32 and the second switching circuit 34.

When a short-circuit detection signal is input to the second switching circuit 34, the second switching circuit 34 selects the second input terminal f and connects the output terminal g to the second input terminal f. Accordingly, the output terminal g of the second switching circuit 34 is put into a high-impedance state. When a short-circuit detection signal is input to the first switching circuit 32, the first switching circuit 32 selects the third input terminal c and connects the output terminal d to the third input terminal c. Accordingly, the output terminal d of the first switching circuit 32 is grounded. Therefore, when a short-circuit detection signal is output from the short-circuit detecting circuit 36, the gate terminal G of the first MOSFET 21 is grounded via the first gate resistor 33. Accordingly, the gate-source voltage Vgs of the first MOSFET 21 is decreased, so that the drain current (short-circuit current) that flows in the first MOSFET 21 is interrupted.

That is, in the second preferred embodiment, when a short-circuit that causes a power supply voltage to be directly applied to the first MOSFET 21 occurs, the drain current (short-circuit current) that flows in the first MOSFET 21 can be interrupted.

The residual life predicting circuit 37 predicts a residual life of the first MOSFET 21 based on the gate current Ig of the first MOSFET 21 detected by the current sensor 41, and outputs a warning signal when the predicted residual life is short. Specifically, the residual life predicting circuit 37 includes a current integrated value calculating circuit 38 and a comparison circuit 39. The current integrated value calculating circuit 38 calculates an integrated value of the gate current Ig of the first MOSFET 21 detected by the current sensor 41. The larger the gate current integrated value, the shorter the residual life of the first MOSFET 21. The comparison circuit 39 outputs a warning signal when the gate current integrated value calculated by the current integrated value calculating circuit 38 becomes larger than a predetermined value.

In the present preferred embodiment, the predetermined value was set as follows. A plurality of samples having the same structure as that of the first MOSFETs 21 were prepared. Each sample was connected to a gate drive circuit with only a gate resistor having the same resistance value as that of the resistance value r1 of the first gate resistor 33, and a short-circuit test was conducted. The short-circuit test was conducted by directly applying a power supply voltage between the drain and the source of the sample when the sample was in an ON state. Then, the gate current was measured during a period from the start of a short-circuit to breakage of the sample, and a gate current integrated value during this period was calculated. By conducting this short-circuit test on the plurality of samples, gate current integrated values of the plurality of samples were obtained. Then, a value corresponding to 90% of the smallest value among the gate current integrated values of the plurality of samples was set as the predetermined value.

The warning signal output from the comparison circuit 39 is sent to the control portion 10A (refer to FIG. 6). The control portion 10A causes the warning device 13 to output a warning when receiving a warning signal. At this time, the control portion 10A may identify which of the gate drive circuits 6A to 9A the warning signal was sent from and may cause the warning device 13 to output a warning by which the MOSFET whose residual life has become short can be identified among the MOSFET 21 to 24. Based on this warning, a user of the inverter circuit 1A can know that the residual life of the MOSFET has become short. That is, in the second preferred embodiment, the time for replacement of the MOSFET is easily grasped.

The first and second preferred embodiments of the present invention have been described above, and further, the present invention can also be carried out in still other preferred embodiments. For example, in the above-described first preferred embodiment and second preferred embodiment, each of the modules 2 to 5 consists of a plurality of voltage control type switching elements Tr connected in parallel, however, each of the modules 2 to 5 may consist of one voltage control type switching element Tr.

In addition, in the above-described first preferred embodiment and second preferred embodiment, an example in which the voltage control type switching elements Tr constituting each of the modules 2 to 5 are SiC-MOSFETs is shown, however, the voltage control type switching elements Tr constituting each of the modules 2 to 5 may be elements other than SiC-MOSFETs.

For example, the voltage control type switching elements Tr constituting each of the modules 2 to 5 may be SiC-IGBTs. In the case where the voltage control type switching elements Tr are SiC-IGBTs, the collectors of the SiC-IGBTs correspond to the drains of the above-described SiC-MOSFETs, and the emitters of the SiC-IGBTs correspond to the sources of the above-described SiC-MOSFETs.

In the above-described preferred embodiments, a case where the present invention is applied to an inverter circuit is described, however, the present invention is also applicable to electronic circuits such as converter circuits, etc., other than inverter circuits.

Although the preferred embodiments of the present invention have been described in detail as above, these are merely specific examples used to clarify the technical content of the present invention, and the present invention should not be understood as being limited to these examples, and the scope of the present invention is to be determined solely by the appended claims.

The present application corresponds to Japanese Patent Application No. 2013-122794 filed in the Japan Patent Office on Jun. 11, 2013, and the entire disclosure of the application is incorporated herein by reference.

REFERENCE SIGNS LIST

1, 1A Inverter circuit
2 to 5 Module (voltage control type switching device)
6 to 9, 6A to 9A Gate drive circuit
10, 10A Control portion
11 Power supply
12 Load
21 to 24 MOSFET
31 Amplifying circuit
32 First switching circuit
33 First gate resistor
34 Second switching circuit
35 Second gate resistor
36 Short-circuit detecting circuit
37 Residual life predicting circuit
38 Current integrated value calculating circuit
39 Comparison circuit
Tr Voltage control type switching element

The invention claimed is:

1. An electronic circuit comprising:
a voltage control type switching device;
an amplifying circuit that amplifies a gate control signal and generates a gate driving signal;
a first gate resistor that has one end connected to a gate terminal of the voltage control type switching device;
a second gate resistor that has one end connected to the gate terminal of the voltage control type switching device, and has a resistance value larger than that of the first gate resistor; and
a switching circuit provided between the amplifying circuit and the first and second gate resistors and controlled by the gate control signal,
wherein the switching circuit is arranged to switch the first gate resistor and the second gate resistor such that a gate voltage is applied for a predetermined time to the gate terminal of the voltage control type switching device via the first gate resistor and then the gate voltage is applied to the gate terminal via the second gate resistor when turning on the voltage control type switching device.

2. The electronic circuit according to claim 1, wherein the switching circuit is arranged to turn the other end of the second gate resistor into a high-impedance state and ground the other end of the first gate resistor when turning off the voltage control type switching device.

3. The electronic circuit according to claim 1, wherein the resistance value of the first gate resistor is not less than 1Ω and not more than 5Ω and the resistance value of the second gate resistor is not less than 1 kΩ.

4. The electronic circuit according to claim 1, wherein on the assumption that the resistance value of the gate resistor is fixed at the resistance value of the first gate resistor, when T is an estimate value of the time from the start of flowing of a short-circuit current in the voltage control type switching device to breakage of the voltage control type switching device, the predetermined time is set to not less than ⅒ and not more than ⅕ of the estimate value T.

5. The electronic circuit according to claim 1, further comprising:
a current detection means that detects a gate current of the voltage control type switching device; and
a gate terminal grounding means that grounds a gate terminal of the voltage control type switching device when the gate current detected by the current detection means becomes larger than a predetermined value.

6. The electronic circuit according to claim 5, wherein the voltage control type switching device consists of one voltage control type switching element or a plurality of voltage control type switching elements connected in parallel.

7. The electronic circuit according to claim 1, further comprising:
a current detection means that detects a gate current of the voltage control type switching device;
a current integrated value calculation means that calculates an integrated value of the gate current detected by the current detection means; and
a warning signal output means that outputs a warning signal when a gate current integrated value calculated by the current integrated value calculation means exceeds a predetermined value.

8. The electronic circuit according to claim 7, wherein the voltage control type switching device consists of one voltage control type switching element or a plurality of voltage control type switching elements connected in parallel.

9. The electronic circuit according to claim 1, wherein the voltage control type switching device consists of one voltage control type switching element or a plurality of voltage control type switching elements connected in parallel.

10. The electronic circuit according to claim 9, wherein the voltage control type switching elements are voltage control type switching elements chiefly made of SiC.

* * * * *